(12) United States Patent
Ku et al.

(10) Patent No.: US 7,688,561 B2
(45) Date of Patent: Mar. 30, 2010

(54) ULTRA-LOW POWER LIMITER

(75) Inventors: Ja-nam Ku, Yongin-si (KR);
Chung-woul Kim, Andong-si (KR);
Young-hoon Min, Anyang-si (KR);
Il-jong Song, Suwon-si (KR);
Dong-hyun Lee, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 495 days.

(21) Appl. No.: 11/360,615

(22) Filed: Feb. 24, 2006

(65) Prior Publication Data

US 2006/0198197 A1 Sep. 7, 2006

(30) Foreign Application Priority Data

Feb. 24, 2005 (KR) ...................... 10-2005-0015456

(51) Int. Cl.
*H02H 3/20* (2006.01)
*H02H 9/04* (2006.01)

(52) U.S. Cl. ..................................... 361/91.1
(58) Field of Classification Search ................. 361/91.1
See application file for complete search history.

(56) References Cited

U.S. PATENT DOCUMENTS

| | | | | |
|---|---|---|---|---|
| 4,994,694 A | * | 2/1991 | Gross | ......................... 327/430 |
| 5,194,927 A | * | 3/1993 | Ueno | ......................... 257/565 |
| 5,488,241 A | * | 1/1996 | Journeau | ..................... 257/273 |
| 5,774,318 A | * | 6/1998 | McClure et al. | ................ 361/56 |
| 5,883,507 A | | 3/1999 | Yin | |

FOREIGN PATENT DOCUMENTS

| | | |
|---|---|---|
| EP | 0845848 A2 | 6/1998 |
| JP | 52-114942 | 3/1976 |
| JP | 06-034676 A | 2/1994 |

OTHER PUBLICATIONS

Korean Office Action dated Sep. 25, 2006 issued in Korean Patent Application No. 2005-15456.

* cited by examiner

*Primary Examiner*—Robert DeBeradinis
*Assistant Examiner*—Scott Bauer
(74) *Attorney, Agent, or Firm*—Sughrue Mion, PLLC

(57) ABSTRACT

An over-voltage protection circuit (i.e., a limiter), includes: a first switching block having a plurality of semiconductor elements, serially connected to each other and turned on in sequence according to the magnitude of an input voltage; and a plurality of second switching blocks, in which each of the second switching blocks includes a pair of serially connected semiconductor elements having different current properties. The second switching blocks are connected in parallel to the first switching block. By minimizing a leakage current when an input voltage is below a reference voltage and by maximizing a leakage current when the input voltage is above the reference voltage, the limiter prevents excessive current from flowing into the RF tag circuit when the input voltage is below the reference voltage, and ensures that a sufficient amount of current is supplied to a regulator when the input voltage is below the reference voltage.

8 Claims, 5 Drawing Sheets

ULTRA-LOW POWER LIMITER

CROSS-REFERENCE TO RELATED APPLICATIONS

This application claims benefit under 35 U.S.C. §119 from Korean Patent Application No. 2005-15456, filed on Feb. 24, 2005, the entire content of which is incorporated herein by reference.

BACKGROUND OF THE INVENTION

1. Field of the Invention

The present invention relates in general to an over-voltage protection circuit (also called a limiter), and more specifically, to an over-voltage protection circuit having a minimum amount of leakage current when an input voltage is below a reference voltage, and having a highly increased leakage current when the input voltage is above the reference voltage.

2. Description of the Related Art

RFID is the abbreviation for Radio Frequency Identification, which also is called a smart tag. RFID is a non-contact recognition system that uses small chips attached to all kinds of items to transfer and process data on objects and their surroundings via radio frequencies.

The basic elements of an RFID system include an antenna, a tag and a reader. The reader identifies a thin planar tag attached to an object, and processes data. Among these RFID systems, a low-frequency identification system (30 kHz-500 kHz) is used in short-distance ($\leq 1.8$ m) data communication, whereas a high-frequency identification system (850 MHz-950 MHz, or 2.4 GHz-2.5 GHz) can transfer data from a long distance (greater than 27 m).

An RF tag is composed of a semiconductor transponder chip and an antenna, and there are two types of RF tags: passive tags and active tags. Passive tags require no internal power source because they receive energy from a reader's radio frequency signal, whereas active tags require a built-in power source (e.g., a battery) for operation.

To obtain data from a passive RF tag, a reader supplies power to the tag through the tag's antenna. Then, the RF tag transmits data as a response to receiving the power. Usually, power is supplied from the antenna based on two methods: one using a magnetic field and the other using a radio wave. Inductive coupling is an example of transferring energy through a magnetic field. That is, an antenna generates a strong high frequency power signal and creates a magnetic field which penetrates the antenna coil of the RF tag. As a result, an electric current is induced, and the RF tag is driven by this current. On the other hand, backscatter coupling is an example of transferring energy by way of a radio wave. Thus, a portion of the power radiated by the antenna is reflected off the RF tag's antenna and is used for operating the RF tag.

In the case of passive RF tags, different levels of RF power are drawn to the RF tags, depending on the distance between an antenna and an RF tag. In other words, the smaller the distance between the antenna and the RF tag, the stronger the RF power drawn to the RF tag. As the RF power becomes greater than the typical RF tag's operational voltage range, 1.5V-5V, circuitry cannot be operated stably. The relation of the distance, $r_{max}$, between the antenna and the RF tag and power, $P_R$, by which the RF tag can operate practically can be formulated as shown in Equation 1 below.

$$r_{max} = \frac{\lambda}{4\pi} \sqrt{\frac{\eta G_T G_R P_T}{P_R}} \qquad \text{[Equation 1]}$$

where $\eta$ is the efficiency of a rectifier, $G_T$ is a gain of the antenna, $P_R$ is the power by which the tag can operate, $G_R$ is the receiver gain, $P_T$ is the transmitted power and $\lambda$ is the wave length of the power signal. According to Equation 1, the distance, $r_{max}$, between the antenna and the RF tag is inversely proportional to the power, $P_R$, by which the RF tag can operate.

In order to avoid excessive voltage from flowing into the circuitry of the RF tag, an over-charge protection circuit, i.e., a limiter, is used.

FIG. 1 is a circuit diagram of an RF tag. As shown in FIG. 1, when RF power is supplied from an antenna to an RF tag, the RF tag converts the RF power into DC power using a diode D1 and a capacitor C1, and supplies the DC power to the limiter 10.

FIG. 2 is a circuit diagram of a limiter used in an RF tag according to a first embodiment of the related art. As depicted in the drawing, a limiter 10 comprises a plurality of serially connected semiconductor switching elements M0, M1, M2, M4, M5, and a semiconductor switching element M3 which is connected in parallel to the other switching elements M0, M1, M2, M4, M5. Here, each of the semiconductor switching elements shown in FIG. 2 is an n-channel MOSFET, and the parallel connected MOSFET M3 receives a gate voltage from one of the serially connected MOSFETs to allow a current to flow between its source and drain.

The limiter 10 makes sure that a maximum amount of current is supplied to a regulator 20 if the input voltage for operating the circuitry of the RF tag is below a reference voltage. On the other hand, the limiter 10 makes sure that that a minimum amount of current is supplied to the regulator 20 if an input voltage for operating the circuitry of the RF tag is above a reference voltage. For instance, suppose that a reference voltage in the circuit diagram of FIG. 2 is 5V, a leakage current is less than 100 nA when an input voltage is below the reference voltage, whereas a leakage current is greater than 100 nA when an input voltage is above the reference voltage. To satisfy these conditions, all current should flow into the regulator if a supply voltage from a rectifying element is less than 5V. In like manner, all current should be grounded rapidly if a supply voltage from a rectifying element is greater than 5V.

In practice, however, 0.45 μA of current has leaked from the reference voltage 5V (please refer to Table 1 below). That is to say, in the related art limiter, it is absolutely impossible for leakage current to increase rapidly even if an input voltage is above the reference voltage.

TABLE 1

| Input voltage (V) | Leakage current |
|---|---|
| 2.5 | 0.053 nA |
| 3.0 | 0.29 nA |
| 4.0 | 13.15 nA |
| 5.0 | 0.45 μA |
| 5.5 | 2.0 μA |
| 6.0 | 7.30 μA |

The reason why leakage current in the related art limiter does not rapidly increase when an input voltage is above the reference voltage can be explained by Equation 2 below, which expresses the properties of a current flowing in a MOSFET.

$$I_D = \frac{1}{2}\mu_n C_{ox} \frac{W}{L}(V_{GS} - V_T)^2(1 + \lambda V_{DS})$$ [Equation 2]

where, $V_{GS}$ is an input voltage between the gate and source of a MOSFET, and $V_T$ is a turn-on voltage supplied to the source for turning on the MOSFET. The other variables in equation 2 are well-known to persons of ordinary skill in the art. As can be seen in Equation 2, the properties of the current flowing in the MOSFET, $I_D$, are proportional to a square of the voltage VGS between the gate and source. Given that the turn-on voltage $V_T$ of the MOSFET is constant, the greater the voltage $V_{GS}$ between the gate and source, the greater the increment amount of leakage current. However, above the reference voltage, the amount of leakage current is not rapidly increased.

FIG. 3 is a circuit diagram of a limiter used in a RF tag according to a second embodiment of the related art. As shown in FIG. 3, the limiter includes a plurality of serially connected n-channel MOSFETs MN0, MN1, MN2, MN4, MN5, and three pairs of n-channel MOSFETs (MN8, MN3), (MN9, MN6), (MN10, MN7) that are connected in parallel to the serially connected n-channel MOSFETs MN0, MN1, MN2, MN4, MN5. Here, a drain voltage of MN1 is input to the gate of MN10 to turn MN10 on. When MN10 is turned on, it supplies a current from a rectifying element to MN7. When MN9 is turned on, a source voltage is input to the gate of MN7 to turn MN7 on. However, MN1 should be turned on first for MN9 to be turned on. In other words, MN7 cannot be turned on until MN1 is turned on. Similarly, a source voltage of MN8 is input to the gate of MN6 that is serially connected to MN9, and MN6 is turned on. Since a source voltage of MN2 is input to the gate of MN8, MN3 should be turned on first for MN5 to be turned on. Meanwhile, a voltage from the rectifying element is input to the gate of MN3 via MN0, MN1, MN2 and MN4, so MN3, like MN0, is turned on when an input voltage exceeds the turn-on voltage of MN3.

In this limiter circuit, each of the serially connected MOSFETs MN0, MN1, MN2, MN4, MN5 is turned on according to an input voltage from the rectifying element, more specifically, is turned on in sequence until the input voltage reaches a predetermined reference voltage. And, among the three pairs of MOSFETs connected in parallel (MN8, MN3), (MN9, MN6), (MN10, MN7), MN10 is turned on when MN0 is turned on, and MN9 and MN7 are turned on almost simultaneously when MN1 is turned on. Moreover, MN8 and MN6 are turned on almost simultaneously when MN2 is turned on. A current is attenuated as it penetrates these MOSFETs being turned on.

Table 2 below lists leakage currents with respect to different input voltages in the limiter circuit of FIG. 3.

TABLE 2

| Input voltage (V) | Leakage current |
| --- | --- |
| 2.5 | 10 µA |
| 3.0 | 112 µA |
| 4.0 | 897 µA |
| 4.5 | 1.6 mA |
| 5.0 | 2.4 mA |
| 5.5 | 3.4 mA |
| 6.0 | 4.5 mA |

As can be seen in Table 2, more than 100 µA of a leakage current is generated when an input voltage is above the reference voltage 5V, creating a current having excellent properties. But still, when an input voltage (3V for example) is below the reference voltage, although the leakage current must be less than 100 nA, the leakage current is 112 µA, which is too much. Consequently, the amount of a current supplied to the regulator 20 is rapidly reduced.

Therefore, there is a need to develop a limiter, in which a minimum amount of current flows into a regulator when an input voltage is below a reference voltage, whereas a maximum amount of current flows into a regulator when an input voltage is above a reference voltage. In this manner, it becomes possible to prevent an excessive voltage from flowing into the RF tag circuit when an input voltage is above the reference voltage, and to supply a sufficient amount of current to the regulator when an input voltage is below the reference voltage.

SUMMARY OF THE INVENTION

Illustrative, non-limiting embodiments of the present invention overcome the above disadvantages and other disadvantages not described above. Also, the present invention is not required to overcome the disadvantages described above, and an illustrative, non-limiting embodiment of the present invention may not overcome any of the problems described above. It is, therefore, an aspect of the present invention to provide a over-voltage protection circuit (also called a limiter), in which a minimum amount of leakage current is created when an input voltage is below a reference voltage, whereas a maximum amount of leakage current is created when an input voltage is above a reference voltage.

To achieve the above advantages, there is provided an over-voltage protection circuit (i.e., a limiter), including: a first switching block including a plurality of semiconductor elements, which are serially connected to each other and are turned on in sequence according to the magnitude of an input voltage from a rectifying element; and at least a pair of second switching blocks, in which each pair is formed of a pair of serially connected semiconductor elements having different current properties, and is connected to the first switching block in parallel.

In an exemplary embodiment, the first switching block comprises n-channel MOSFETs.

Each of the second switching blocks can comprise an n-channel MOSFET, and a PNP-type BJT serially connected to the n-channel MOSFET.

The second switching blocks can be connected to each other in parallel.

In an exemplary embodiment, each of the n-channel MOSFETs in the second switching blocks receives a gate voltage from each of the n-channel MOSFETs in the first switching block.

In an exemplary embodiment, each of the n-channel MOSFETs in the second switching blocks supplies a voltage to an emitter of each PNP-type BJT.

The over-charge projection circuit can further include: a plurality of n-channel MOSFETs, each being serially connected to a corresponding n-channel MOSFET in the second switching blocks and receiving a gate voltage from corresponding n-channel MOSFETs in the first switching block.

BRIEF DESCRIPTION OF THE DRAWINGS

The above aspects and features of the present invention will be more apparent by describing certain embodiments of the present invention with reference to the accompanying drawings, in which.

DETAILED DESCRIPTION OF EXEMPLARY EMBODIMENTS

Exemplary embodiments of the present invention will be described herein below with reference to the accompanying drawings.

Figure 4:
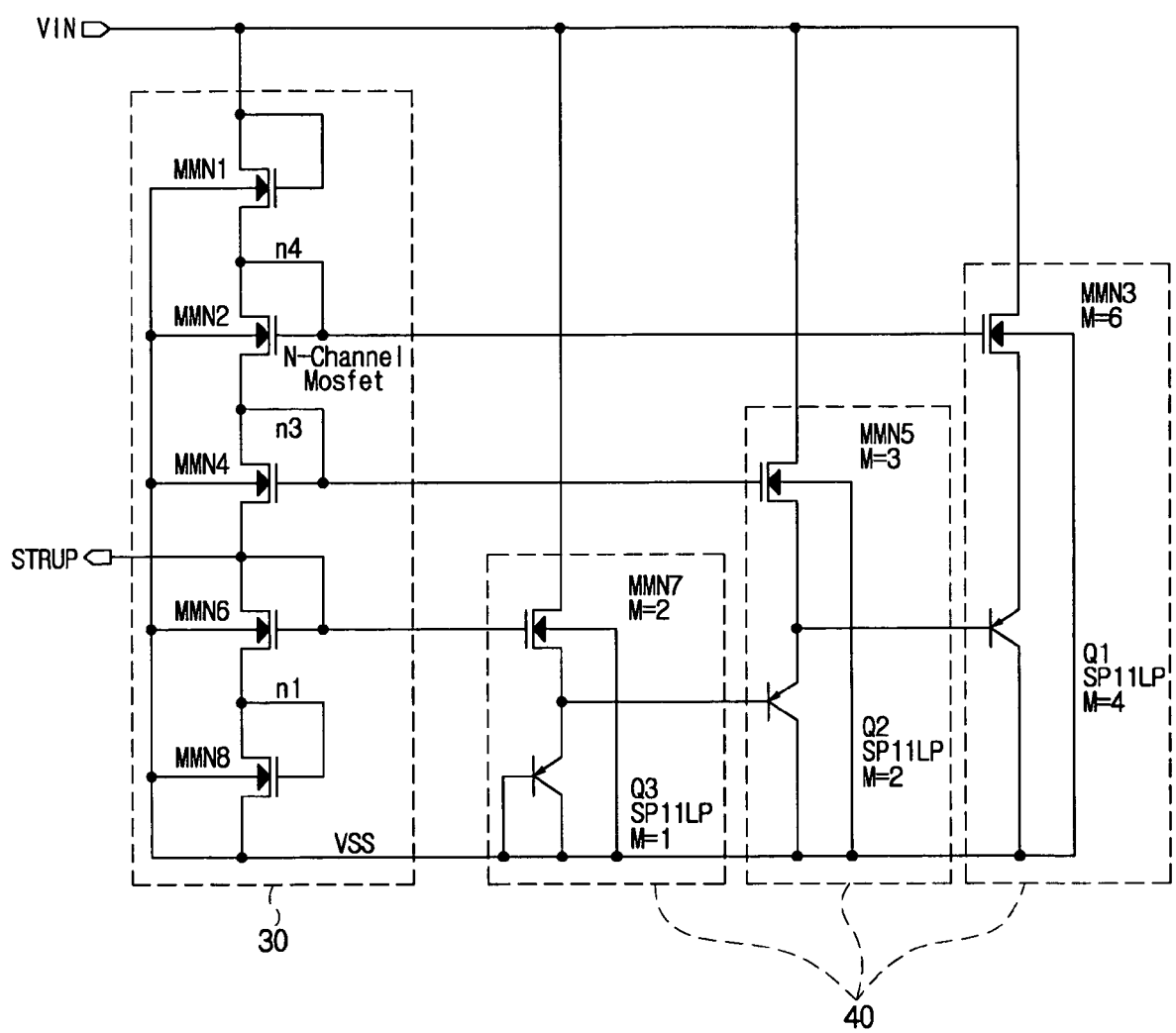
FIG. 4 is a circuit diagram of an over-voltage protection circuit (limiter) according to a first preferred embodiment of the present invention.

FIG. 4 is a circuit diagram of an over-voltage protection circuit (limiter) according to a first embodiment of the present invention. As shown in FIG. 4, the over-voltage protection circuit includes a first switching block 30 having a plurality of serially connected switches, and a plurality of second switching block pairs 40, each pair not only being connected to each other in parallel, but also being connected in parallel to the switches of the first switching block 30.

Each switch in the first switching block 30 MMN1, MMN2, MMN4, MMN6, MMN8 has an n-channel MOSFET. The gate and drain of each switch in the first switching block 30 are connected, so a constant voltage is supplied thereto. Thus, each switch in the first switching block 30 functions as a diode. The number of serially connected switches in the first switching block 30 is determined by a reference voltage defining a reference for the control of a leakage current, and by a turn-on voltage turning on the first switching block 30.

Each pair of the second switching blocks 40 (MMN7, Q3) (MMN5, Q2) (MMN3, Q1) includes a MOSFET (MMN7, MMN5 or MMN3), and a bipolar junction transistor (BJT) (Q3, Q2 or Q1) which is serially connected to a corresponding MOSFET (MMN7, MMN5 or MMN3, respectively). Here, a gate voltage from one of the switches in the first switching block 30 is input to the gate of the MOSFET in one of the second switching blocks 40. For example, a gate voltage of MMN2 is input to the gate of MMN3, a gate voltage of MMN4 is input to the gate of MMN5, and a gate voltage of MMN6 is input to the gate of MMN7. As MMN3 in the second switching block 40 uses the same gate voltage as MMN2 in the first switching block 30, MMN3 and MMN2 are turned on simultaneously. For the same reason, (MMN5 and MMN4), and (MMN7 and MMN6) are turned on simultaneously.

Each BJT (Q3, Q2, Q1) in the second switching blocks 40 is a substrate PNP transistor. In detail, Q1 is turned on by a drain voltage supplied to an emitter thereof when MMN3 is turned on, Q2 is turned on interlockingly with MMN5, and Q3 is turned on interlockingly with MMN7.

The properties of current, $I_E$, flowing in the BJTs of the second switching blocks 40 can be expressed by Equation 3 below.

$$I_E = I_{CO}\frac{W}{L}e^{\frac{V_{BE}}{V_T}} \quad \text{[Equation 3]}$$

As can be seen in Equation 3, the properties of current flowing in BJTs are exponentially proportional to a voltage $V_{BE}$ between the base and the emitter. Therefore, by the nature of the exponential function, it is possible to design an over-voltage protection circuit (limiter) in such a manner that a leakage current rapidly increases above a specific reference voltage, simply by adjusting a turn-on voltage $V_T$ and an input voltage.

The following now explains in detail the operation of the over-voltage protection circuit (limiter) in two different cases: the first case where an input voltage below a reference voltage is input, and the second case where an input voltage above a reference voltage is input, respectively.

First of all, when an input voltage below a reference voltage is input, the number of switches being turned on in the first switching block 30 is changed according to the input voltage. For instance, suppose that a reference voltage is 5V, there are five switches in the first switching block 30, and a turn-on voltage for each switch in the first switching block 30 is 1V. If an input voltage is less than 1V, it means that no current has leaked from the input voltage. Thus, the input voltage is fully supplied to a regulator. Moreover, if an input voltage is between 1V and 2V, only MMN1 in the first switching block 30 is turned on. At this time, although the turn-on voltage is less than 1V, MMN3, MMN5 and MMN7 in the second switching blocks 40 are not turned on because the input voltage is input to the source thereof, not the gate.

On the other hand, if an input voltage is greater than 2V, MMN2, MMN4, MMN6 and MMN8 are turned on in sequence as the input voltage increases. In detail, MMN2 and MMN3 are turned on simultaneously, MMN4 and MMN5 are turned on simultaneously, and MMN6 and MMN7 are turned on simultaneously. Once MMN3, MMN5 and MMN7 are turned on, BJTs Q1, Q2 and Q3 receiving an emitter voltage from MMN3, MMN5 and MMN7, respectively, are also sequentially turned on.

When an input voltage reaches the reference voltage 5V, every MOSFET in the first switching block 30, and each MOSFET and each BJT in the second switching blocks 40 are turned on. Then an input voltage from a rectifying element passes through all the transistors in the first switching block 30 and the second switching blocks 40, and a leakage current is rapidly increased.

In the case where an over-voltage protection circuit (limiter) is designed according to this embodiment, leakage currents with respect to input voltages are as follows:

TABLE 3

| Input voltage (V) | Leakage current |
|---|---|
| 2.5 | 0.14 nA |
| 3.0 | 1.72 nA |
| 4.0 | 0.57 μA |
| 5.0 | 85.9 μA |
| 5.5 | 410 μA |
| 6.0 | 1.10 mA |

Figure 1:
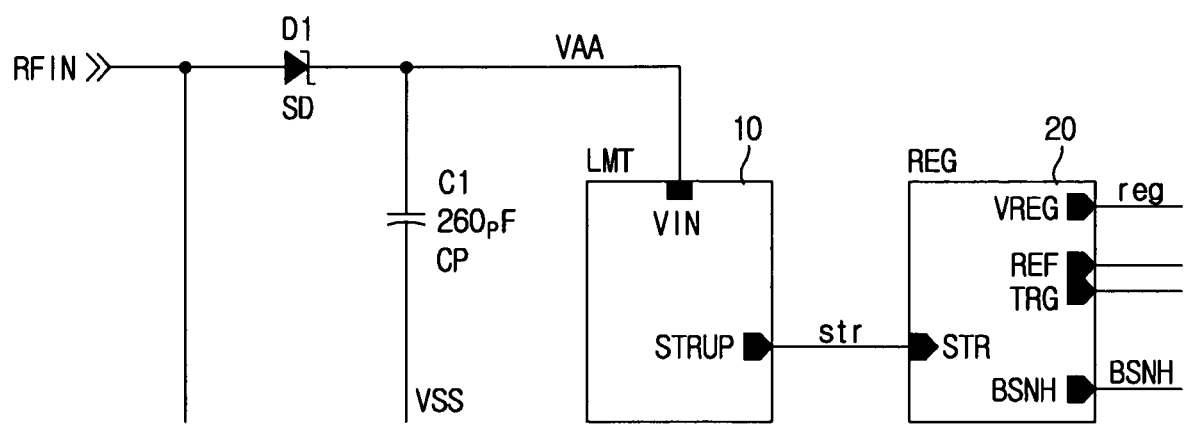
FIG. 1 is a circuit diagram of an RF tag.
Figure 2:
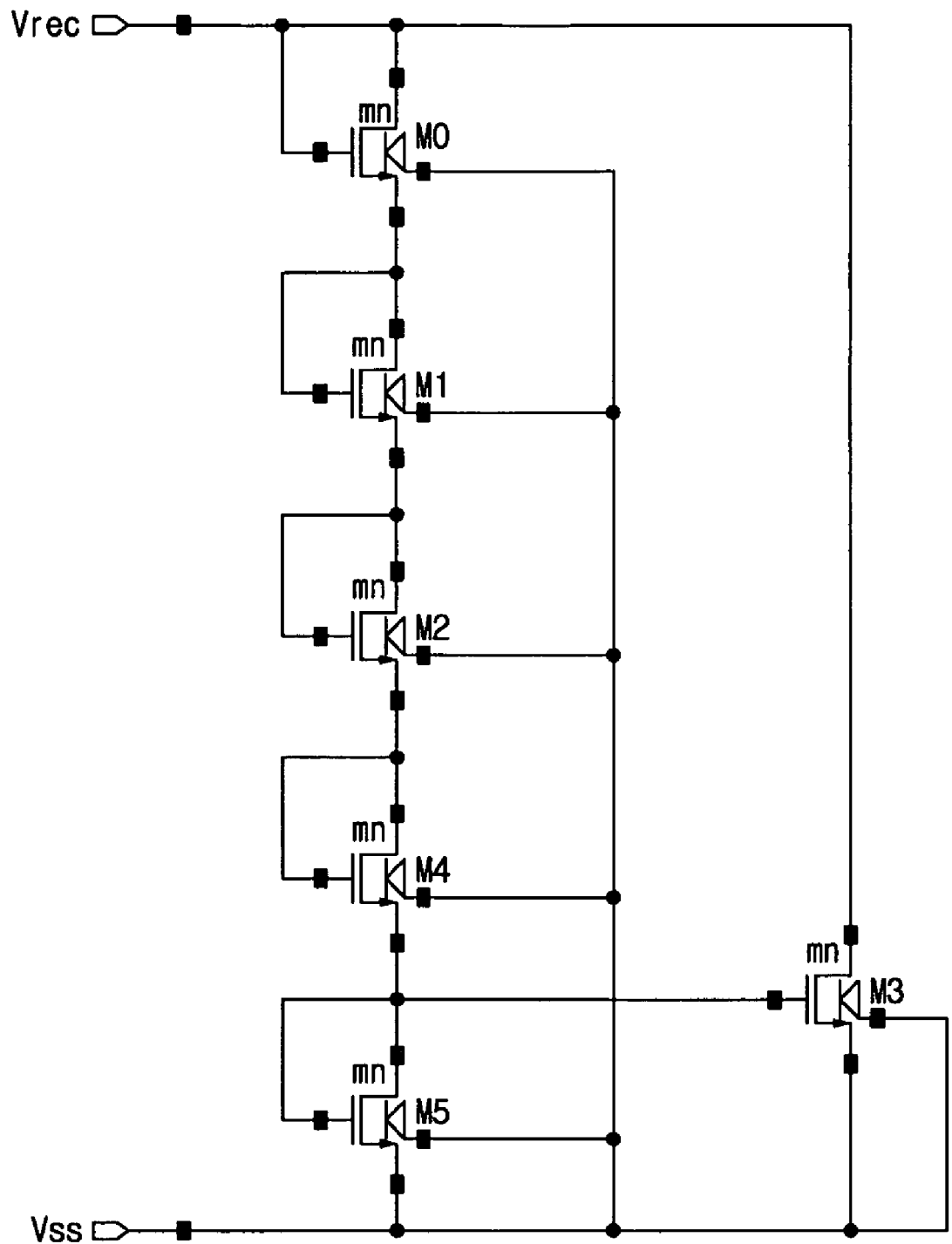
FIG. 2 is a circuit diagram of a limiter used in an RF tag according to a first embodiment of the related art.
Figure 3:
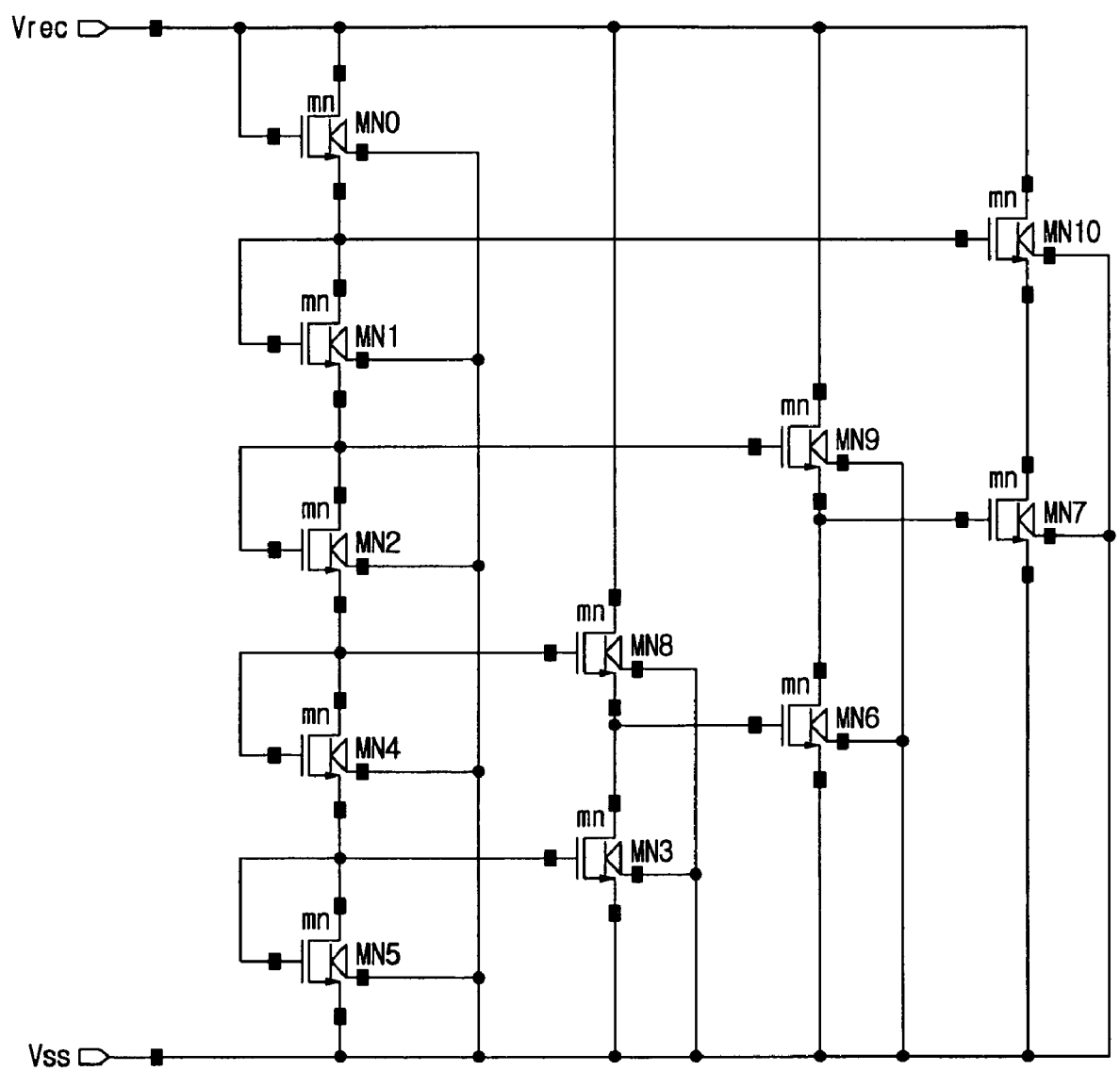
FIG. 3 is a circuit diagram of a limiter used in an RF tag according to a second embodiment of the related art.

As can be seen in Table 3, when an input voltage is above 5V a leakage current rapidly increases to 410 μA and 1.10 mA for example. On the other hand, when an input voltage is below 5V a leakage current is very small as 0.14 nA, 1.72 nA, and 0.57 µA. Especially, the leakage current at the reference voltage 5V amounts to 85.9 µA, which is two hundred times the leakage current generated in the related art of FIG. 2. This result proves that the over-charge protection circuit (limiter) of the present invention is capable of minimizing a leakage current when an input voltage is below the reference voltage, whereas maximizing a leakage current when an input voltage is above the reference voltage.

Figure 5:
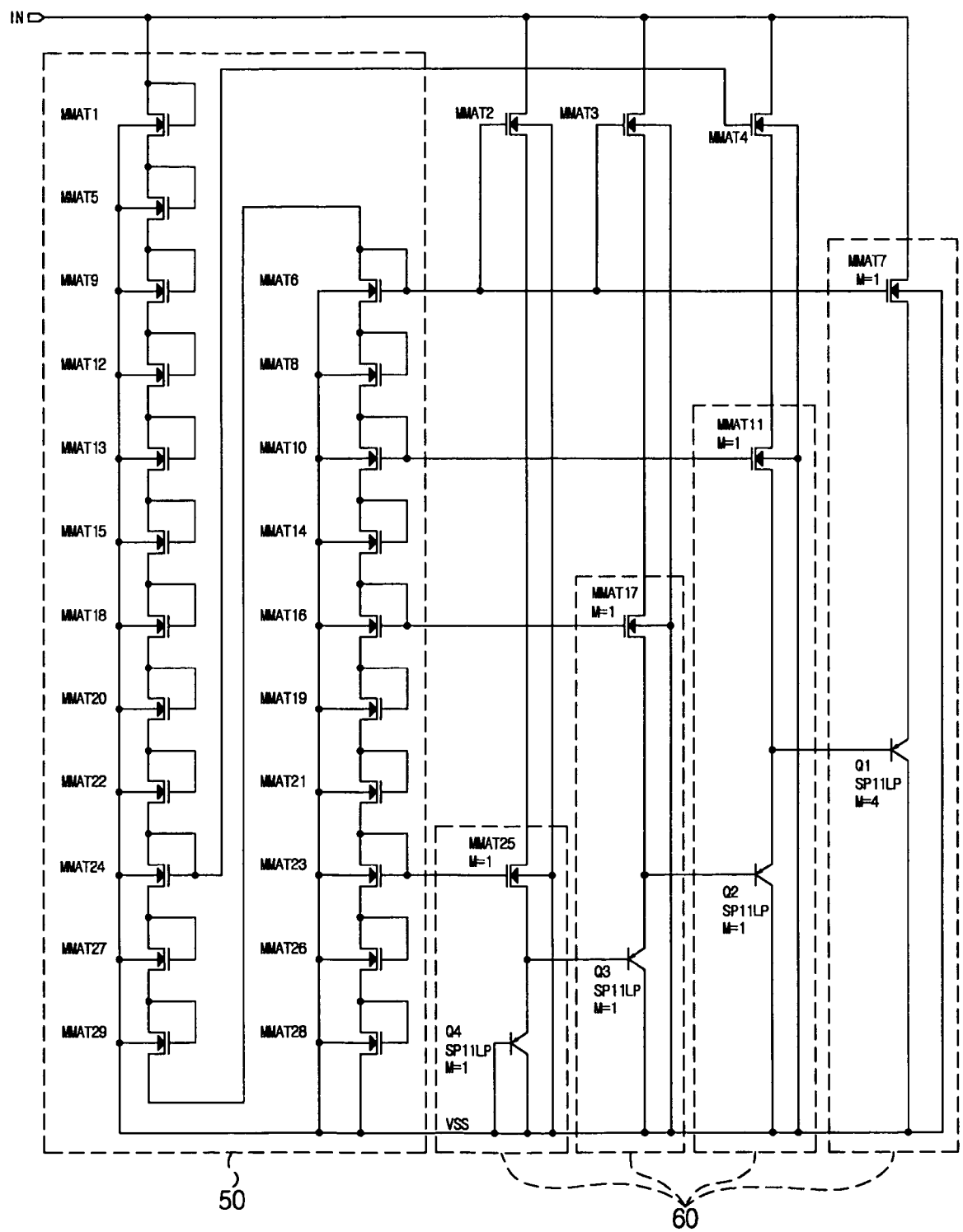
FIG. 5 is a circuit diagram of an over-voltage protection circuit (limiter) according to a second preferred embodiment of the present invention.

FIG. 5 is a circuit diagram of an over-voltage protection circuit (limiter) according to a second embodiment of the present invention. In particular, the limiter in this embodiment is used in a memory like an EEPROM. Generally, an EEPROM requires a 15-20V operational voltage, and cannot generate a sufficient leakage current using only a typical limiter. For this reason, a charge pump limiter is utilized to maintain an input voltage to the circuitry at a constant level, and to adjust a leakage current.

The charge pump limiter (please refer to FIG. 5) includes a first switching block 50 including a plurality of serially connected n-channel MOSFETs, and a plurality of second switching blocks 60, each including an n-channel MOSFET and a PNP-type BJT and being connected in parallel to the first switching block 50. The charge pump limiter is very similar to the over-voltage protection circuit (limiter) in FIG. 4 in that each MOSFET in the second switching blocks 60 is turned on by a gate voltage from a corresponding MOSFET in the first switching block 50, and each BJT is turned on by an emitter voltage from a corresponding MOSFET in the second switching blocks 60. However, the charge pump limiter differs from the limiter in FIG. 4 in that it includes a plurality of MOSFETs MMAT2, MMAT3, MMAT4, which are serially connected to the MOSFETs of the each of the second switching blocks 60 and receive a gate voltage from the MOSFETs MMAT6 and MMAT24. MOSFETs MMAT2, MMAT3, MMAT4 are arranged in positions closer to an input voltage than the MOSFETs in the first switching block 50 that provide a gate voltage to each of the MOSFET in the second switching blocks 60.

Moreover, according to power consumption at the second switching blocks 60, a sum of the voltages at MMAT 26 and MMAT28 is equal to a sum of the voltages at MMAT25 and Q4. As an input voltage is increased, a leakage current from MMAT 26 and MMAT28 is increased in proportion to the square of a voltage between the gate and the source, and a leakage current at Q4 is increased exponentially to the voltage between the base and the emitter. This phenomenon occurs almost identically for Q1, Q2, and Q3. Therefore, in the charge pump limiter of FIG. 5, a leakage current is increased exponentially by change in an input voltage.

As explained so far, the over-voltage protection circuit of the present embodiment of the invention utilizes BJTs instead of conventional MOSFETs, for increasing a leakage current in the second switching blocks 60. In this way, the leakage current is increased exponentially according to the properties of a current flowing in each BJT. By minimizing a leakage current when an input voltage is below a reference voltage and by maximizing a leakage current when an input voltage is above a reference voltage, these embodiments of the present invention not only prevent an excessive voltage from flowing into the RF tag circuit when the input voltage is below the reference voltage, but it also ensures that a sufficient amount of current is supplied to the regulator when the input voltage is below the reference voltage.

The foregoing embodiment and advantages are merely exemplary and are not to be construed as limiting the present invention. The present teachings can be readily applied to other types of apparatuses. Also, the description of the embodiments of the present invention is intended to be illustrative, and not to limit the scope of the claims, and many alternatives, modifications, and variations will be apparent to those skilled in the art.

What is claimed is:

1. An over-voltage protection circuit, comprising:
   a first switching block having a plurality of semiconductor elements serially connected to each other and turned on in sequence according to the magnitude of an input voltage; and
   a plurality of second switching blocks, in which each of the second switching blocks includes a pair of serially connected semiconductor elements having different current properties, and is connected to the first switching block;
   wherein each of the second switching blocks comprises a MOSFET device and a bipolar junction transistor (BJT) serially connected to the MOSFET device,
   wherein each of the second switching blocks is connected to the first switching block through a gate of the MOSFET device;
   wherein the bipolar junction transistors are turned on in sequence according to the magnitude of the input voltage, and
   wherein a base of at least one bipolar junction transistor in at least one of the second switching blocks is connected to an emitter of a bipolar junction transistor in another one of the second switching blocks.

2. The circuit according to claim 1, wherein the first switching block is comprised of MOSFET devices.

3. The circuit according to claim 2, wherein the MOSFET devices are n-channel MOSFET devices.

4. The circuit according to claim 1, wherein the second switching blocks are connected to each other in parallel.

5. The circuit according to claim 4, wherein each of the MOSFET devices in the second switching blocks receives a gate voltage from a MOSFET device in the first switching block.

6. The circuit according to claim 5, wherein for each of the second switching blocks the MOSFET device of the second switching block supplies a voltage to an emitter of the BJT of the second switching block.

7. The circuit according to claim 6, wherein the MOSFET devices are n-channel MOSFET devices and the BJT is a PNP-type BJT.

8. The circuit according to claim 1, further comprising:
   a plurality of MOSFET devices, each being serially connected to a corresponding MOSFET in one of the second switching blocks and receiving a gate voltage from a corresponding MOSFET device in the first switching block.

* * * * *